(12) United States Patent
Min

(10) Patent No.: US 11,057,993 B2
(45) Date of Patent: Jul. 6, 2021

(54) PRINTED CIRCUIT BOARD

(71) Applicant: SAMSUNG ELECTRO-MECHANICS CO., LTD., Suwon-si (KR)

(72) Inventor: Tae Hong Min, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 0 days.

(21) Appl. No.: 16/671,611

(22) Filed: Nov. 1, 2019

(65) Prior Publication Data

US 2021/0022243 A1     Jan. 21, 2021

(30) Foreign Application Priority Data

Jul. 16, 2019 (KR) .................. 10-2019-0085883

(51) Int. Cl.
| | |
|---|---|
| *H05K 1/03* | (2006.01) |
| *H05K 1/02* | (2006.01) |
| *H05K 1/11* | (2006.01) |
| *H05K 1/09* | (2006.01) |
| *H05K 1/18* | (2006.01) |

(52) U.S. Cl.
CPC ......... *H05K 1/0393* (2013.01); *H05K 1/0298* (2013.01); *H05K 1/092* (2013.01); *H05K 1/116* (2013.01); *H05K 1/028* (2013.01); *H05K 1/0281* (2013.01); *H05K 1/11* (2013.01); *H05K 1/18* (2013.01); *H05K 2201/0141* (2013.01); *H05K 2201/0154* (2013.01); *H05K 2201/2009* (2013.01)

(58) Field of Classification Search
CPC .... H05K 1/0393; H05K 1/116; H05K 1/0298; H05K 1/092
See application file for complete search history.

(56) References Cited

U.S. PATENT DOCUMENTS

| | | | |
|---|---|---|---|
| 2011/0123772 A1 | 5/2011 | Lee et al. | |
| 2014/0186581 A1 | 7/2014 | Lee et al. | |
| 2016/0050768 A1* | 2/2016 | Chen ................. | H01L 24/20 |
| | | | 361/728 |
| 2017/0135196 A1* | 5/2017 | Kim .................. | H05K 1/0204 |
| 2019/0069398 A1* | 2/2019 | Sugiyama ........... | H05K 3/0014 |
| 2019/0104237 A1* | 4/2019 | Sugiyama ........... | H05K 1/0298 |

FOREIGN PATENT DOCUMENTS

| | | |
|---|---|---|
| KR | 10-1092587 B1 | 12/2011 |
| KR | 10-1381135 B1 | 4/2014 |
| KR | 10-2014-0086522 A | 7/2014 |
| KR | 10-2018-0060695 A | 6/2018 |

* cited by examiner

*Primary Examiner* — Ishwarbhai B Patel
(74) *Attorney, Agent, or Firm* — Morgan, Lewis & Bockius LLP

(57) ABSTRACT

A printed circuit board is disclosed. The printed circuit board includes a first substrate portion, and a second substrate portion connected to the first substrate portion and having a flexible insulating layer bendable with respect to the first substrate portion. The second substrate portion includes a block member disposed in the flexible insulating layer and a circuit pattern disposed on a region of the flexible insulating layer, in which the block member is embedded.

19 Claims, 4 Drawing Sheets

PRINTED CIRCUIT BOARD

CROSS-REFERENCE TO RELATED APPLICATION(S)

This application claims benefit of priority to Korean Patent Application No. 10-2019-0085883 filed on Jul. 16, 2019 in the Korean Intellectual Property Office, the disclosure of which is incorporated herein by reference in its entirety.

TECHNICAL FIELD

The present disclosure relates to a printed circuit board.

BACKGROUND

Recently, with the development of ultra-high definition displays and antenna modules for high frequency transmissions, demand for rigid-flexible printed circuit boards has increased.

However, in order to apply a rigid-flexible printed circuit board to a high-performance device, high circuit density is required in a confined space, and demand for a technology for mounting an electronic device or implementing a microcircuit in a flexible substrate portion is increasing.

SUMMARY

According to an aspect of the present disclosure, a printed circuit board includes a first substrate portion and a second substrate portion, connected to the first substrate portion and having a flexible insulating layer bendable with respect to the first substrate portion. The second substrate portion includes a block member disposed in the flexible insulating layer and a circuit pattern disposed on a region of the flexible insulating layer, in which the block member is embedded.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
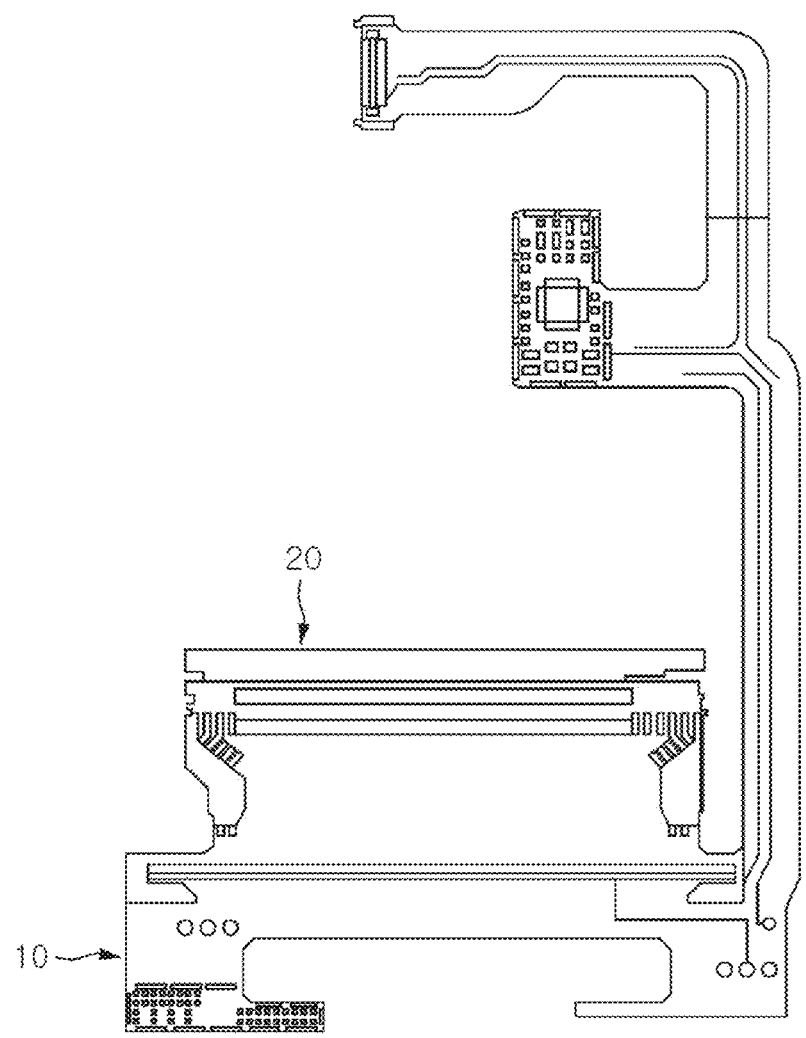
FIG. 1 is a view illustrating a printed circuit board according to an embodiment of the present disclosure.

An embodiment of a printed circuit and a method of manufacturing the same according to the present disclosure will be described in detail with reference to the attached drawings, and the same and corresponding components will be given the same reference numerals and redundant description thereof will be omitted.

It will be apparent that though the terms first, second, etc. may be used herein to describe various members, components, regions, layers and/or sections, these members, components, regions, layers and/or sections should not be limited by these terms. These terms are only used to distinguish one member, component, region, layer or section from another region, layer or section.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween.

FIG. 1 is a view illustrating a printed circuit board according to an embodiment of the present disclosure.

Referring to FIG. 1, a printed circuit board according to an embodiment of the present disclosure includes a first substrate portion 10 and a second substrate portion 20.

The first substrate portion 10 is a portion to which the second substrate portion 20 is connected. The first substrate portion 10 of the present embodiment may be a rigid substrate on which bending is not scheduled. That is, the first substrate portion 10 may be made of a material having higher rigidity than the second substrate portion 20 having flexible insulating layers 22 (shown in FIG. 3) and 24 (shown in FIG. 3).

Alternatively, a portion of the first substrate portion 10 connected to the second substrate portion 20 may be formed of a rigid substrate, but another portion of the first substrate portion 10 may be formed of a flexible substrate.

The second substrate portion 20 is connected to the first substrate portion 10, and is provided with flexible insulating layers 22 and 24 that can be bent. The printed circuit board of the present embodiment may have a rigid-flex PCB structure of a rigid-flex structure in which the first substrate portion 10 is a rigid substrate, and the second substrate portion 20 is a flexible substrate.

For example, a flexible insulating layer such as a polyimide film is stacked to form a flexible substrate that can be bent, and a rigid insulating layer such as a circuit pattern and an epoxy (relatively harder insulating layer than that of the flexible insulating layer), may be selectively and additionally formed on the flexible substrate to form a rigid substrate that has a harder material than the flexible substrate. Accordingly, a printed circuit substrate having a rigid-flex structure in which a portion of only the flexible substrate becomes the second substrate portion 20 that can be bent and a remaining portion becomes the first substrate portion 10 of the rigid substrate may be formed. Here, ductility and rigidity mean the difference in a degree of bendability with reference to each other, a material having a degree of strength that can be bent according to intention of a user is called a soft material, and a material having a degree of strength that cannot be bent is called a hard material.

In particular, the second substrate portion 20 of the present embodiment may include a block member 30 (shown in FIGS. 2 and 3) inserted into the flexible insulating layers 22 and 24. In one example, the block member 30 may be stiffer than the flexible insulating layers 22 and 24. The block member 30 may be inserted into a portion of the flexible insulating layers 22 and 24 that does not require bending, thereby increasing strength and suppressing deformation (expansion or contraction) due to heat. Accordingly, dimensional stability may be increased on the flexible insulating layers 22 and 24 into which the block member 30 is inserted, such that a precise circuit pattern may be formed on the second substrate portion 20 or an electronic device may be mounted. The block member 30 may include a metal having a low coefficient of thermal expansion, or an alloy such as invar, covar, or the like, in order to increase strength of the second substrate portion 20 and prevent thermal deformation.

Figure 2:
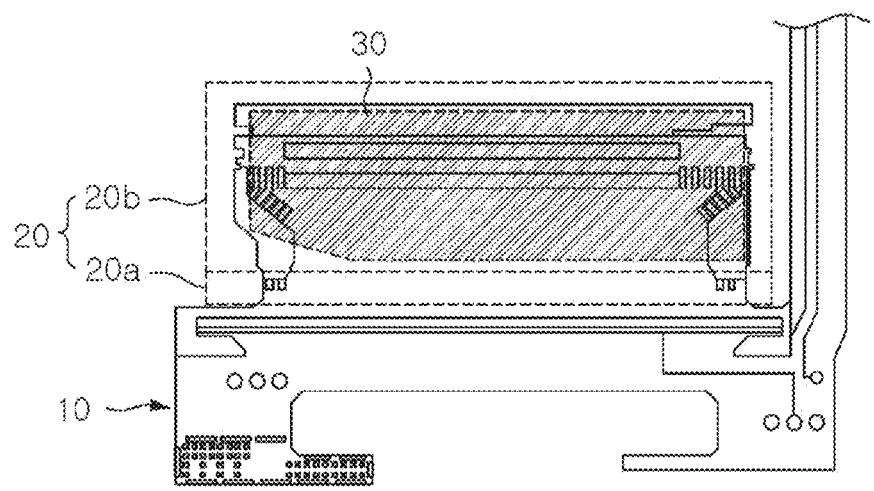
FIGS. 2 and 3 illustrate a second substrate portion in a printed circuit board according to an embodiment of the present disclosure.
Figure 3:
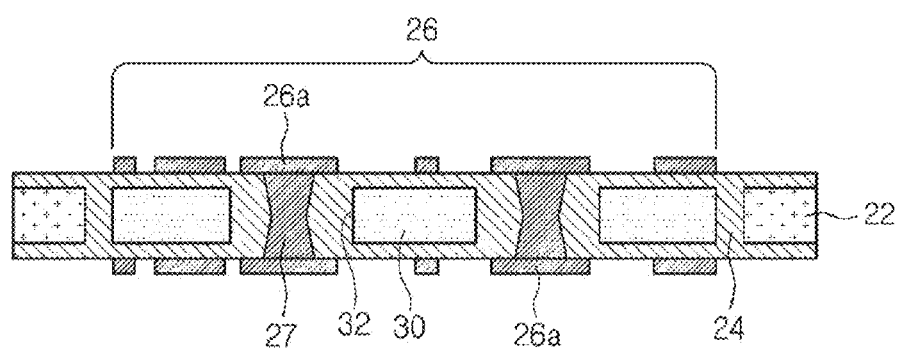

FIGS. 2 and 3 are views illustrating a second substrate portion in a printed circuit board according to an embodiment of the present disclosure.

Referring to FIG. 2, the second substrate portion 20 of the present embodiment may include a first region 20a disposed adjacent to the first substrate portion 10 and connected to the first substrate portion 10 and may be bent and a second region 20b spaced apart from the first substrate portion 10 and into which the block member 30 is inserted. That is, the second substrate portion 20 including the flexible insulating layers 22 and 24 may be divided into the first region 20a into which the block member is not inserted and the second region 20b into which the block member 30 is inserted. In this case, the first region 20a is a portion that can be bent and connected to the first substrate portion 10. Accordingly, when bending of the second substrate portion 20 with respect to the first substrate portion 10 is required, the first region 20a of the second substrate portion 20 may be bent or folded with respect to the first substrate portion 10.

In this case, the circuit pattern 26 is formed on a region into which the block member 30 is inserted in the flexible insulating layers 22 and 24. That is, the circuit pattern 26 may be formed on the second region 20b into which the block member 30 is inserted to increase dimensional stability.

Referring to FIG. 3, a circuit pattern 26 may be formed on one surface of the flexible insulating layers 22 and 24. In this case, the circuit pattern 26 may include a pad 26a, and the pad 26a may be formed on the second region 20b. The pad 26a requires high dimensional stability for reliable connection. Accordingly, it is preferable that the pad 26a is formed in the second region 20b into which the block member 30 is inserted. As compared with the circuit pattern formed in an outer region of the block member 30, the pad 26a may have lower thermal deformation and may have higher strength.

In addition, a through-hole 32 may be formed in the block member 30, and a via 27 connected to the circuit pattern 26 may be formed in the through-hole 32. In this case, inside the through-hole 32, the flexible insulating layers 22 and 24 may be interposed between the block member 30 and the via 27.

Referring to FIG. 3, the via 27 may be disposed in the through-hole 32, and the via 27 may be connected to the pad 26a. In this case, a second insulating material 24 may be filled between the via 27 and the through-hole 32. In this case, the via 27 may be spaced apart from the material forming the block member 30 by the second insulating material 24.

In addition, a primer or metal particles may be applied to the surface of the block member 30 inserted into the flexible insulating layers 22 and 24. The metal particles such as a primer and copper may increase a bonding force between the flexible insulating layers 22 and 24 and the block member 30.

In addition, the flexible insulating layers 22 and 24 of the present embodiment may have a composite structure of the first insulating material 22 and the second insulating material 24.

Referring to FIG. 3, a through region into which the block member 30 is inserted may be formed in the first insulating material 22. The second insulating material 24 may have a structure to embed the first insulating material 22 and the block member 30. The first insulating material 22 forms a main portion of the flexible insulating layers 22 and 24, and the block member 30 having the second insulating material 24 inserted into the first insulating material 22 may be bonded to the first insulating material 22. In this case, the second insulating material 24 may be made of a material having higher flowability than that of the first insulating material 22 so as to facilitate filling between the first insulating material 22 and the block member 30.

In this case, the first insulating material 22 may include a polyimide or a liquid crystal polymer (LCP). In particular, the liquid crystal polymer has a similar coefficient of thermal expansion to copper, so there is little deformation during the process, and dimensional stability is higher than other materials. In addition, the liquid crystal polymer has a low dielectric constant and low dielectric loss, which is advantageous for high speed signal transmission.

In addition, the second insulating material 24 may include a bonding sheet. Since the bonding sheet has better flowability than the liquid crystal polymer, the bonding sheet may easily fill a space between the first insulating material 22 and the block member 30.

In addition, a seed layer or a primer layer may be further formed on the second insulating material 24. For example, a seed layer or a primer layer may be formed on a bonding sheet embedding the first insulating material 22 made of a liquid crystal polymer. The seed layer and the primer layer may increase adhesion of the circuit pattern 26 to the second insulating material 24.

In this case, the seed layer may include a copper foil or a transferred metal layer. For example, a very thin copper foil may be attached to the bonding sheet to form a seed layer. In addition, a metal layer such as chromium (Cr) and zinc (Zn) may be formed on the bonding sheet to form a seed layer. In this case, the metal layer may be formed to a thickness of about an atomic layer by transferring a metal such as chromium (Cr) and zinc (Zn) to the bonding sheet.

Figure 4:
FIGS. 4 to 8 illustrate a method of manufacturing a second substrate portion in a printed circuit board according to an embodiment of the present disclosure.
Figure 5:

FIGS. 4 to 8 are views illustrating a method of manufacturing a second substrate portion in a printed circuit board according to an embodiment of the present disclosure Referring to FIGS. 4 and 5, the block member 30 may be prepared, and the through-hole 32 in which the vias 27 will be disposed may be formed in the block member 30.

Figure 6:
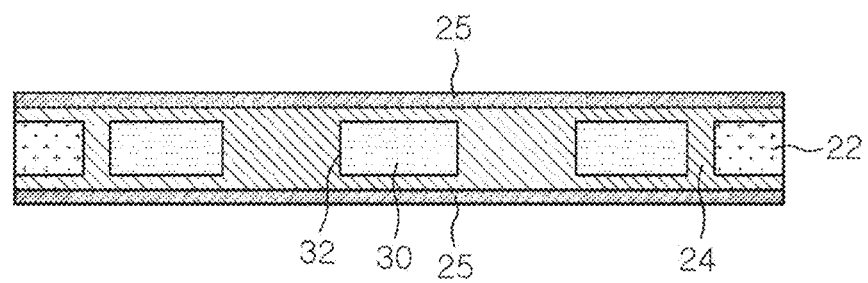

Referring to FIG. 6, the block member 30 may be inserted into and disposed on the first insulating material 22. In this case, a through region into which the block member 30 may be inserted in the first insulating material 22 may be formed.

In addition, the first insulating material 22 may be filled with the second insulating material 24 to couple the block member 30 and the first insulating material 22. In this case, the second insulating material 24 may be made of a material having higher flowability than the first insulating material 22 so as to facilitate filling between the first insulating material 22 and the block member 30. In this case, the second insulating material 24 may be filled also in the through-hole 32 of the block member 30.

In addition, the second insulating material 24 may be stacked on both surfaces of the first insulating material 22, such that the second insulating material 24 may embed both the first insulating material 22 and the block member 30. In this case, the metal layer 25 may be formed on one surface or on both surfaces of the second insulating material 24.

Figure 7:
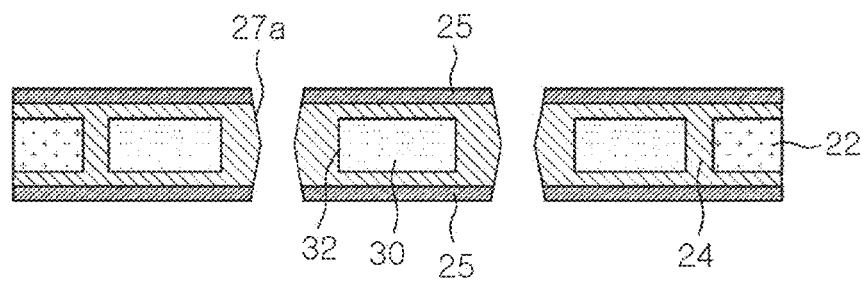

Referring to FIG. 7, a via hole 27a may be formed in the second insulating material 24 of the through-hole 32.

Figure 8:
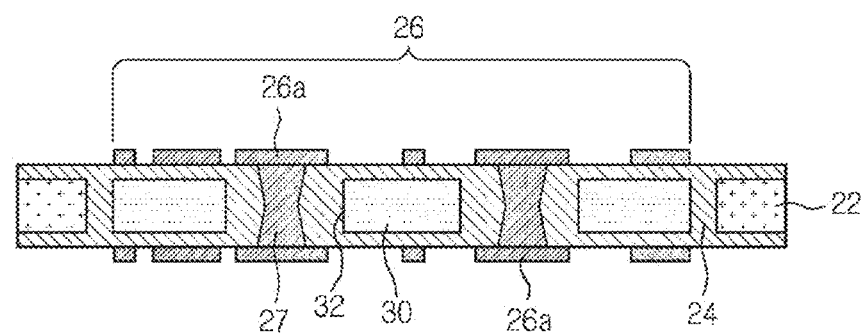

Referring to FIG. 8, a via 27 may be formed by filling the via holes 27a by plating. In addition, the circuit pattern 26 may be formed by patterning the metal layer 25.

Figure 9:
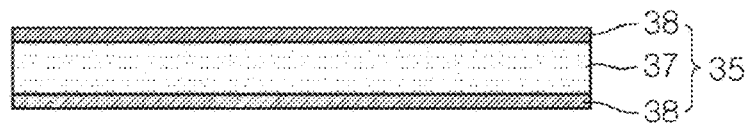
FIGS. 9 to 10 illustrate a method of manufacturing a second substrate portion in a printed circuit board according to another embodiment of the present disclosure.
Figure 10:
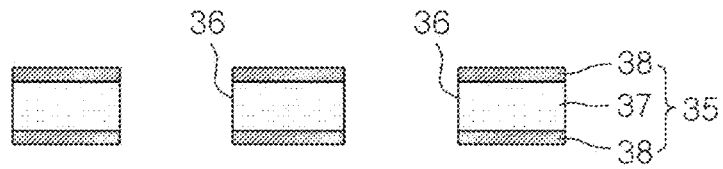

FIGS. 9 to 10 are views illustrating a method of manufacturing a second substrate portion in a printed circuit board according to another embodiment of the present disclosure.

Referring to FIG. 9, a block member 35 may include a plurality of layers formed of different metals. For example, the block member 25 may be formed by stacking a copper layer 38 on both surfaces of an alloy layer 37 such as invar, covar, and the like, having a low coefficient of thermal expansion.

Referring to FIG. 10, a through-hole 36 in which vias 27 are to be disposed may be formed in the block member 35.

Thereafter, a method of forming the first insulating material 22, the second insulating material 24, the circuit pattern 26, and the via 27 is similar to that of the above-described embodiment. In a case in which the block member 35 shown in FIG. 10 is used in the second substrate portion 20, the copper layers 38 disposed on the surfaces of the alloy layer 37 may remain in the second substrate portion 20. In this case, the second insulating material 24 may cover the copper layers 38 of the block member 35. In one example, the copper layers 38 of the block member 35 embedded in the second substrate portion 20 may be electrically insulated from the via 27 and the circuit pattern 26.

Figure 11:
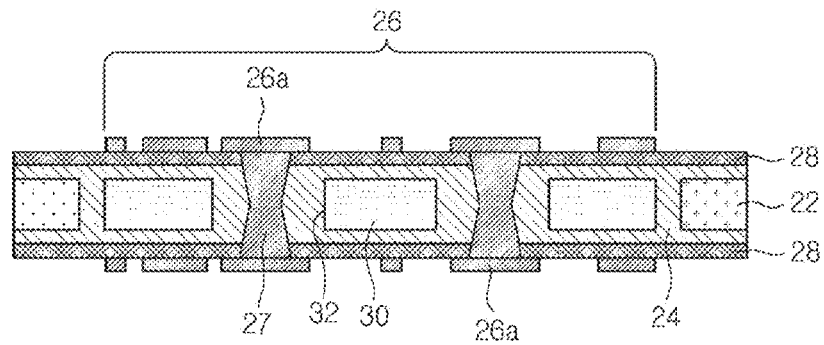
FIG. 11 is a view illustrating a second substrate portion in a printed circuit board according to another embodiment of the present disclosure.

FIG. 11 is a view illustrating a second substrate portion in a printed circuit board according to another embodiment of the present disclosure.

Referring to FIG. 11, the flexible insulating layer may further include a third insulating material 28 stacked on the second insulating material.

In this case, the third insulating material 28 may include a Teflon resin. The Teflon resin has a lower dielectric loss than a liquid crystal polymer, which is more advantageous for high speed signal transmission.

Figure 12:
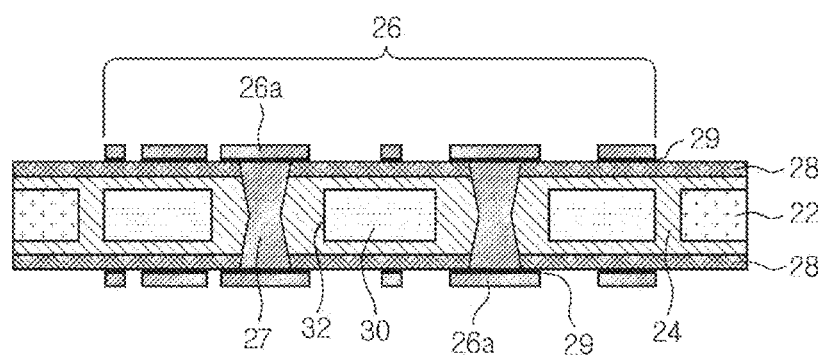
FIGS. 12 and 13 illustrate a second substrate portion in a printed circuit board according to another embodiment of the present disclosure.
Figure 13:

FIGS. 12 and 13 are views illustrating a second substrate portion in a printed circuit board according to another embodiment of the present disclosure.

Referring to FIG. 12, a seed layer 29 or a primer layer may be further formed on a third insulating material. The seed layer 29 and the primer layer may increase adhesion of a circuit pattern 26 to the third insulating material 28.

In this case, the seed layer 29 may include a copper foil or a transferred metal layer.

Referring to FIG. 13, for example, a very thin copper foil may be attached to a third insulating material 28 to form a seed layer 29.

In addition, a metal layer such as chromium (Cr) and zinc (Zn) may be formed on the third insulating material 28 to form the seed layer 29. In this case, the metal layer may be formed to a thickness of about an atomic layer by transferring a metal such as chromium (Cr), zinc (Zn), and the like, to the bonding sheet.

In this case, referring to FIG. 12, the seed layer 29 may become part of the circuit pattern 26. In addition, portions of the seed layer 29 that do not become part of the circuit pattern 26 may be selectively removed from the third insulating material 28.

While exemplary embodiments have been shown and described above, it will be apparent to those skilled in the art that modifications and variations could be made without departing from the scope of the present invention as defined by the appended claims.

What is claimed is:

1. A printed circuit board, comprising:
a first substrate portion; and
a second substrate portion connected to the first substrate portion and having a flexible insulating layer bendable with respect to the first substrate portion,
wherein the second substrate portion comprises a block member and the flexible insulating layer,
the flexible insulating layer includes a first insulating layer and a second insulating layer,
the first insulating layer and the block member are embedded in the second insulating layer,
the block member has upper and lower surfaces opposing each other and a side surface connecting the upper and lower surfaces,
a circuit pattern disposed on a region of the flexible insulating layer, in which the block member is embedded, and
the second insulating layer extends continuously to cover the upper surface, the side surface, and the lower surface of the block member.

2. The printed circuit board of claim 1, wherein the second substrate portion comprises:
a first region, adjacent to the first substrate portion and connected to the first substrate portion, the first region bendable with respect to the first substrate portion; and
a second region spaced apart from the first substrate portion, the block member embedded in the second region.

3. The printed circuit board of claim 2, wherein the circuit pattern is disposed on the second region.

4. The printed circuit board of claim 1, wherein the block member has a through-hole, in which a via connected to the circuit pattern is disposed.

5. The printed circuit board of claim 1, wherein the block member comprises a metal material.

6. The printed circuit board of claim 5, wherein the block member is provided with a plurality of layers formed of different metals.

7. The printed circuit board of claim 1, wherein the block member is disposed in a through-hole of the first insulating layer, and
the second insulating layer covers an entirety of the upper surface, the lower surface, and the side surface of the block member.

8. The printed circuit board of claim 7, wherein the block member has a through-hole, in which a via connected to the circuit pattern is disposed,
the second insulating layer includes a portion disposed between the block member and the via, inside the through-hole of the blocking member, and covers all of surfaces of the block member.

9. The printed circuit board of claim 7, wherein the first insulating layer comprises a liquid crystal polymer (LCP).

10. The printed circuit board of claim 7, wherein a material of the second insulating layer has higher flowability than a material of the first insulating layer.

11. The printed circuit board of claim 7, further comprising a seed layer or a primer layer disposed on the second insulating layer.

12. The printed circuit board of claim 11, wherein the seed layer comprises a copper foil or a transferred metal layer.

13. The printed circuit board of claim 7, wherein the flexible insulating layer further comprises a third insulating layer disposed on the second insulating layer.

14. The printed circuit board of claim 13, wherein the third insulating layer comprises a Teflon resin.

15. The printed circuit board of claim 13, further comprising a seed layer or a primer layer disposed on the third insulating layer.

16. The printed circuit board of claim 15, wherein the seed layer comprises a copper foil or a transferred metal layer.

17. The printed circuit board of claim 1, further comprising a primer or metal particles disposed on a surface of the block member.

18. The printed circuit board of claim 1, wherein the block member is stiffer than the flexible insulating layer.

19. The printed circuit board of claim 1, wherein the block member is spaced apart from a portion of the flexible insulating layer connected to the first substrate portion.

\* \* \* \* \*